(12) United States Patent
Lin et al.

(10) Patent No.: US 9,502,114 B1
(45) Date of Patent: Nov. 22, 2016

(54) NON-VOLATILE TERNARY CONTENT-ADDRESSABLE MEMORY WITH BI-DIRECTIONAL VOLTAGE DIVIDER CONTROL AND MULTI-STEP SEARCH

(71) Applicant: National Tsing Hua university, Hsinchu (TW)

(72) Inventors: Chien-Chen Lin, Hsinchu (TW); Albert Lee, New Taipei (TW); Chieh-Pu Lo, Taipei (TW); Meng-Fan Chang, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 14/941,587

(22) Filed: Nov. 14, 2015

(51) Int. Cl.
  *G11C 15/04* (2006.01)
  *G11C 15/02* (2006.01)

(52) U.S. Cl.
  CPC ............. *G11C 15/046* (2013.01); *G11C 15/02* (2013.01)

(58) Field of Classification Search
  CPC ............................... G11C 15/02; G11C 15/046
  See application file for complete search history.

(56) References Cited

U.S. PATENT DOCUMENTS

| | | | | |
|---|---|---|---|---|
| 7,675,765 B2* | 3/2010 | Derharcobian | ..... | G11C 11/5678 365/148 |
| 7,978,490 B2* | 7/2011 | Lee | ..... | G11C 13/0004 365/148 |
| 8,023,299 B1* | 9/2011 | Gharia | ..... | G11C 11/16 365/49.1 |
| 8,320,148 B1* | 11/2012 | Derhacobian | ..... | G11C 13/0011 365/49.1 |
| 9,087,572 B2* | 7/2015 | Sekar | ..... | G11C 15/00 |
| 9,230,649 B2* | 1/2016 | Chang | ..... | G11C 15/046 |
| 9,299,435 B2* | 3/2016 | Sakimura | ..... | G11C 15/02 |
| 9,312,006 B2* | 4/2016 | Chang | ..... | G11C 15/046 |
| 2013/0054886 A1* | 2/2013 | Eshraghian | ..... | G11C 15/046 711/108 |
| 2015/0248936 A1* | 9/2015 | Best | ..... | G11C 13/0002 365/49.17 |

* cited by examiner

*Primary Examiner* — Harry W Byrne
*Assistant Examiner* — R Lance Reidlinger
(74) *Attorney, Agent, or Firm* — Li & Cai Intellectual Property (USA) Office

(57) ABSTRACT

A cell for a non-volatile ternary content-addressable (TCAM) memory is provided. The cell comprises a first variable resistive element, a first transistor and a charge control transistor. Two terminals of the first variable resistive element are respectively electrically coupled to a first search-line and a storage node. A drain electrode of the first transistor is electrically coupled to the storage node. A source electrode of the first transistor is electrically coupled to a low-side search-line. A gate electrode of the charge control transistor coupled to a match-line is electrically coupled to the storage node. When the cell operates in a search phase and the first transistor is turned on, a pulse voltage is applied across the first search-line and the low-side search-line for determining whether the voltage of the storage node is larger than a match threshold during the period of the pulse.

20 Claims, 16 Drawing Sheets

| Stored data | R state | NX voltage (search"1") | NX voltage (search"0") | ML voltage (search"1") | ML voltage (search"0") |
|---|---|---|---|---|---|
| 1 | LRS | $<V_{HT-NML}$ | $>V_{HT-NML}$ | High | 0V |
| 0 | HRS | $>V_{HT-NML}$ | $<V_{HT-NML}$ | 0V | High |
| X | MRS | $<V_{HT-NML}$ | $<V_{HT-NML}$ | High | High |

FIG.1B

| Store Data | Write Mode | R State | DLn | DLp | SLr | SLn | SLp |
|---|---|---|---|---|---|---|---|
| 1 | SET | LRS | $V_{G\text{-}SET\text{-}L}$ | $V_{RESET}$ | $V_{SET}$ | 0 | $V_{RESET}$ |
| 0 | RESET | HRS | 0 | 0 | 0 | 0 | $V_{RESET}$ |

FIG.3B

| Store Data | Write Mode | R State | DLn | DLp | SLr | SLn | SLp |
|---|---|---|---|---|---|---|---|
| X | RESET =>SET | HRS=> MRS | 0=> $V_{G\text{-}SET\text{-}M}$ | 0=> $V_{RESET}$ | 0=> $V_{SET}$ | 0 | $V_{RESET}$ |

FIG.4B

NON-VOLATILE TERNARY CONTENT-ADDRESSABLE MEMORY WITH BI-DIRECTIONAL VOLTAGE DIVIDER CONTROL AND MULTI-STEP SEARCH

BACKGROUND OF THE INVENTION

1. Field of the Invention

The instant disclosure relates to a ternary content-addressable memory (TCAM); in particular, to a non-volatile ternary content-addressable memory (TCAM) with bi-directional voltage divider control and multi-step search.

2. Description of Related Art

Content-addressable memory (CAM) is a type of computer memory used in high speed searching applications. Content-addressable memory quickly compares a string of input data with stored data, and outputs the address of matched data. Binary content-addressable memory is the simplest CAM for storing data with two states including "0" and "1". Ternary content-addressable memory (TCAM) is for storing data for one or more bits in the stored dataword with three states. The first state is "0", the second state is "1" and the third matching state is"X" (or "Don't Care") which means always match.

The conventional ternary content-addressable memory comprises an array (all storage cells; 1 row as 1 entry, 1 column as 1 bit), a decoder for choosing which row to write, a main controller for producing control signals, a data-in circuit for writing data or searching data, a sense amplifier (SA) for sensing the compared result and amplifying the result, and an output encoder for transferring the result into an address which has matching data. In a write phase, it writes data to the storage cell(s). In a search phase, it compares input data with memory content (all data in storage cells), and outputs the address of identical (matching) content.

Furthermore, non-volatile TCAM stores data in a non-volatile element. The stored data still remains when power supply is turned off. Usually, the non-volatile element can be a resistive storage device, such as phase change material (PCM), magnetic tunnel junction (MTJ), or memristor etc. which have been utilized in the phase change random-access memory (PCRAM), the resistive random-access memory (RRAM) or the magnetoresistive random-access memory (MRAM).

SUMMARY OF THE INVENTION

The object of the instant disclosure is to provide a non-volatile ternary content-addressable memory (TCAM) with a bi-directional voltage divider control and multi-step search.

In order to achieve the aforementioned objects, according to an embodiment of the instant disclosure, a cell for a non-volatile ternary content-addressable memory is provided. The cell comprises a first variable resistive element, a first transistor and a charge control transistor. A first terminal of the first variable resistive element is electrically coupled to a first search-line. A second terminal of the first variable resistive element is a storage node. The first transistor is controlled by a first control signal. A drain electrode of the first transistor is electrically coupled to the storage node. A source electrode of the first transistor is electrically coupled to a low-side search-line. The charge control transistor is electrically coupled to a match-line for controlling the voltage level of the match-line. A gate electrode of the charge control transistor is electrically coupled to the storage node. When the cell operates in a search phase and the first transistor is turned on by the first control signal, a pulse voltage is applied across the first search-line and the low-side search-line for determining whether the voltage of the storage node is larger than a match threshold during the period of the pulse.

In order to achieve the aforementioned objects, according to an embodiment of the instant disclosure, a cell for a non-volatile ternary content-addressable memory is provided. The cell comprises a first variable resistive element, a first transistor, a second transistor and a charge control transistor. A first terminal of the first variable resistive element is electrically coupled to a first search-line. A second terminal of the first variable resistive element is a storage node. The first transistor is controlled by a first control signal. A drain electrode of the first transistor is electrically coupled to the storage node. A source electrode of the first transistor is electrically coupled to a low-side search-line. The second transistor is controlled by a second control signal. A drain electrode of the second transistor is electrically coupled to the storage node. A source electrode of the second transistor is electrically coupled to a high-side search-line. The charge control transistor is electrically coupled to a match-line for controlling the voltage level of the match-line. A gate electrode of the charge control transistor is electrically coupled to the storage node. The cell can operate in a search phase comprising an operation of searching "1" and an operation of searching "0". During the operation of searching "1", the first transistor is turned off by the first control signal, the second transistor is turned on by the second control signal, the first search-line and the low-side search-line are at a low logic state, and the high-side search-line is applied with a positive bias voltage. During the operation of searching "0", the first transistor is turned on by the first control signal, the second transistor is turned off by the second control signal, the first search-line is at a high logic state, the low-side search-line is at the low logic state, and the high-side search-line is applied by the positive bias voltage.

In order to achieve the aforementioned objects, according to an embodiment of the instant disclosure, a cell for a non-volatile ternary content-addressable memory is provided. The cell comprises a first variable resistive element, a first word-line transistor, a second variable resistive element, a second word-line transistor, a first transistor, a second transistor and a charge control transistor. A first terminal of the first variable resistive element is electrically coupled to a first search-line through the first word-line transistor. A second terminal of the first variable resistive element is a storage node. A first terminal of the second variable resistive element is electrically coupled to the second search-line through the second word-line transistor. A second terminal of the second variable resistive element is electrically coupled to the storage node. The first transistor is controlled by a first control signal. A drain electrode of the first transistor is electrically coupled to the storage node. A source electrode of the first transistor is electrically coupled to a low-side search-line. The second transistor is controlled by a second control signal. A drain electrode of the second transistor is electrically coupled to the storage node. A source electrode of the second transistor is electrically coupled to a high-side search-line. The charge control transistor is electrically coupled to a match-line for controlling the voltage level of the match-line. A gate electrode of the charge control transistor is electrically coupled to the storage node. The cell can operate in a search phase comprising a first phase and a second phase. The first phase comprises an operation of searching "1" and an operation of searching "0" for the first variable resistive element. The second phase comprises an operation of searching "1" and an operation of searching "0" for the second variable resistive element.

In order to achieve the aforementioned objects, according to an embodiment of the instant disclosure, a cell for a non-volatile ternary content-addressable memory is provided. The cell comprises N word-line transistors, N variable resistive elements, a first transistor, a second transistor and a charge control transistor, wherein N is an integer. The variable resistive element has a first terminal and a second terminal. The first terminal of an N-th variable resistive element is electrically coupled to an N-th search-line through an N-th word-line transistor. The second terminals of the N variable resistive elements are connected together for being a storage node. The first transistor is controlled by a first control signal; wherein a drain electrode of the first transistor is electrically coupled to the storage node, a source electrode of the first transistor is electrically coupled to a low-side search-line. The second transistor is controlled by a second control signal; wherein a drain electrode of the second transistor is electrically coupled to the storage node, and a source electrode of the second transistor is electrically coupled to a high-side search-line. The charge control transistor is electrically coupled to a match-line for controlling the voltage level of the match-line. A gate electrode of the charge control transistor is electrically coupled to the storage node. When the cell operates in a search phase, the first transistor or the second transistor is turned on, and a pulse voltage is sequentially applied across the N-th search-line and one of the low-side search-line and the high-side search-line for determining whether the voltage of the storage node is larger than a match threshold during the period of the pulse.

In summary, the provided cells for a non-volatile ternary content-addressable memory (TCAM) have smaller cell area, fast search speed, and low search energy compared to the conventional TCAM cell. Also, the provided cells have free standby cell leakage, and can wake up fast.

In order to further the understanding regarding the instant disclosure, the following embodiments are provided along with illustrations to facilitate the disclosure of the instant disclosure.

BRIEF DESCRIPTION OF THE DRAWINGS

FIG. 1B illustrates a table showing the program states of the first variable resistive element in the 2T1R cell of FIG. 1A;

FIG. 3B illustrates a table showing the program states of the 3T1R cells of FIG. 3A respectively writing "1" and "0";

FIG. 4B illustrates a table showing the program states of the 3T1R cells of FIG. 4A writing "X" in two cycles;

DETAILED DESCRIPTION OF THE PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

Figure 1A:
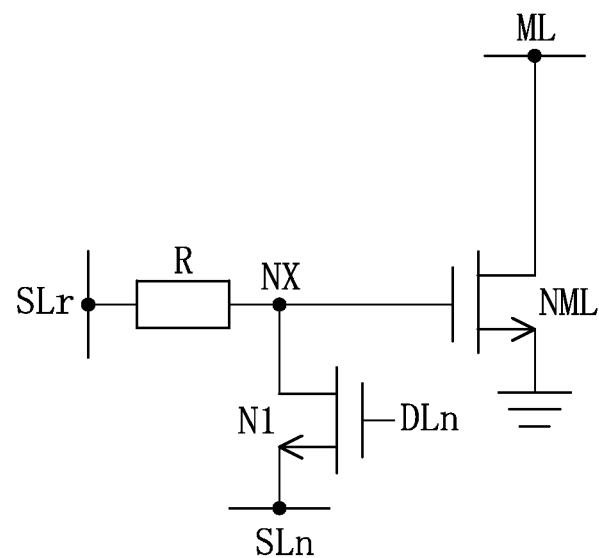
FIG. 1A shows a circuit diagram of a 2T1R cell for a non-volatile ternary content-addressable memory according to an embodiment of the instant disclosure.

Please refer to FIG. 1A showing a circuit diagram of a 2T1R cell for a non-volatile ternary content-addressable memory according to an embodiment of the instant disclosure. The 2T1R cell comprises a first variable resistive element R, a first transistor N1 and a charge control transistor NML. The first variable resistive element R is a non-volatile device. The first variable resistive element R can be any type of resistive storage device, such as PCM, MRAM, MTJ, RRAM, or memristor etc.

A first terminal of the first variable resistive element R is electrically coupled to a first search-line SLr. A second terminal of the first variable resistive element is used to be a storage node NX. The first transistor N1 is controlled by a first control signal DLn. A drain electrode of the first transistor N1 is electrically coupled to the storage node NX. A source electrode of the first transistor N1 is electrically coupled to a low-side search-line SLn. The charge control transistor NML is electrically coupled to a match-line ML for controlling the voltage level of the match-line ML. A gate electrode of the charge control transistor NML is electrically coupled to the storage node NX.

The charge control transistor NML can be an NMOS transistor, but this instant disclosure is on so restricted. The charge control transistor NML is used to couple a match-line ML to a ground, if the charge control transistor NML is conducted by the voltage of the storage node NX. The charge control transistor NML will be turned on to discharge the match-line ML when input data mismatches with stored data of the cell. In detail, when input data mismatches with stored data of the cell, the voltage of the storage node NX will be higher than the threshold voltage $V_{TH-NML}$ (which is considered as a match threshold) of the charge control transistor NML, so as to turn on the charge control transistor NML. Detailed operations of the 2T1R cell are described as follows.

Please refer to FIG. 1B. FIG. 1B illustrates a table showing the program states of the first variable resistive element in the 2T1R cell of FIG. 1A. The first variable resistive element R has a high resistance state HRS, a low resistance state LRS, and a medium resistance state MRS. The 2T1R cell stores logic "1" value when the first variable resistive element R is at the low resistance state LRS. The 2T1R cell stores logic "0" value when the first variable resistive element R is at the high resistance state HRS. The 2T1R cell stores logic "X" (don't care) value when the first variable resistive element R is at the medium resistance state MRS.

The operation of the 2T1R cell comprises a write phase and a search phase. In the write phase, the write operation of the 2T1R cell can be the same as the write operation used for the conventional resistive storage device, that is a writing voltage can be applied to the first variable resistive element R controlled by a write-line. When the 2T1R cell operates in the search phase and the first transistor N1 is turned on by the first control signal DLn, a pulse voltage is applied across the first search-line SLr and the low-side search-line SLn for determining whether the voltage of the storage node NX is larger than the match threshold $V_{TH\text{-}NML}$ during the period of the pulse. In the embodiment shown in FIG. 1A, the mentioned pulse voltage could be generated by two search operations including an operation of searching "1" and an operation of searching "0", wherein search results of these two operations can indicate the stored value ("1", "0" or "X") in the 2T1R cell. As shown in the table of FIG. 1B, high logic state of the match-line (ML) voltage resulted from the operation of searching "1" and low logic state of the match-line (ML) voltage resulted from the operation of searching "0" indicate the stored data state is "1". Low logic state of the match-line (ML) voltage resulted from the operation of searching "1" and high logic state of the match-line (ML) voltage resulted from the operation of searching "0" indicate the stored data state is "0". High logic state of the ML voltage resulted from both of the operation of searching "1" and the operation of searching "0" indicate the stored data state is "X".

Figure 1C:
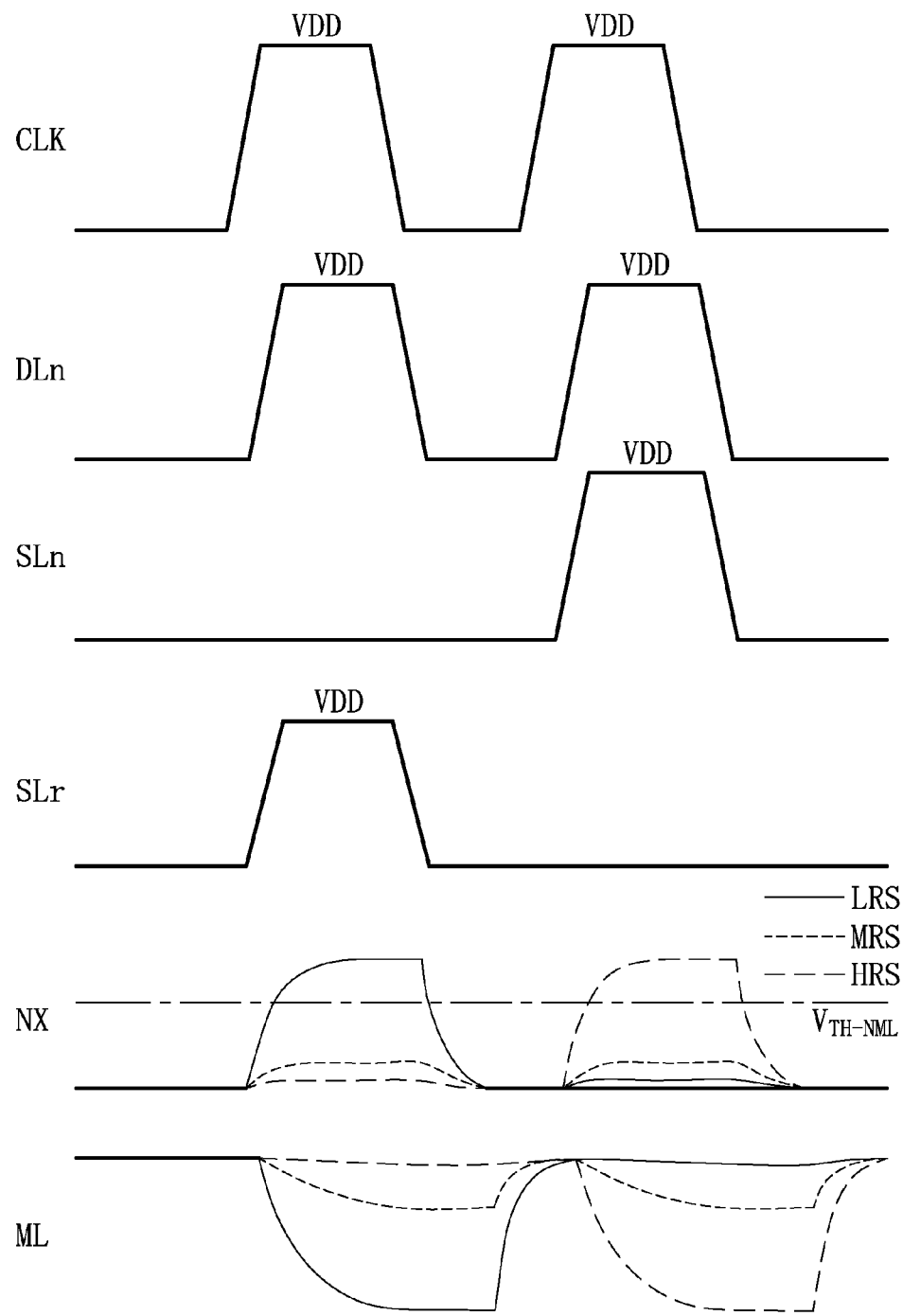
FIG. 1C shows a timing diagram of the 2T1R cell shown in FIG. 1A operating in the search phase.

Please refer to FIG. 1C showing a timing diagram of the 2T1R cell shown in FIG. 1A operating in the search phase. The search phase begins with the operation of searching "0" followed by the operation of searching "1", but the instant disclosure is not restricted thereto. Before each time of the operation of searching "1" and the operation of searching "0", the match-line (ML) voltage is pre-charged to a high logic state (pre-charge voltage $V_{PRE}$, for example).

In the operation of searching "0", the first search-line SLr is at the high logic state (VDD) and the low-side search-line SLn is at the low logic state (0V). When the first transistor N1 is turned on, a current flow begins from the first search-line SLr, through the first variable resistive element R and the first transistor N1, to the low-side search-line SLn. The voltage of the storage node NX will be determined due the resistance state (HRS, LRS, or MRS). When the resistance state of the first variable resistive element R is LRS, the storage node NX voltage will be higher than the match threshold $V_{TH\text{-}NML}$. Thus, the charge control transistor NML is turned on, such that the voltage of the match-line ML will drop to low logic state (about 0V). When the resistance state of the first variable resistive element R is HRS, the storage node NX voltage will be lower than the match threshold $V_{TH\text{-}NML}$. Thus, the charge control transistor NML is turned off, such that the voltage of the match-line ML will maintain at high logic state. When the resistance state of the first variable resistive element R is MRS, the storage node NX voltage will be lower than the match threshold $V_{TH\text{-}NML}$. Thus, the charge control transistor NML is turned off, such that the voltage of the match-line ML will maintain at high logic state.

In the operation of searching "1", the low-side search-line SLn is at a high logic state (VDD) and the first search-line SLr is at a low logic state (0V). When the first transistor N1 is turned on, a current flow begins from the low-side search-line SLn, through the first transistor N1 and the first variable resistive element R, to the first search-line SLr. The first transistor N1 and the first variable resistive element R constitute a voltage divider. Accordingly, the voltage of the storage node NX will be determined due to the resistance state (HRS, LRS, or MRS) of the first variable resistive element R determined in the write phase of the 2T1R cell. When the resistance state of the first variable resistive element R is LRS, the storage node NX voltage will be lower than the match threshold $V_{TH\text{-}NML}$. Thus, the charge control transistor NML is turned off, such that the voltage of the match-line ML will maintain at high logic state. When the resistance state of the first variable resistive element R is HRS, the storage node NX voltage will be higher than the match threshold $V_{TH\text{-}NML}$. Thus, the charge control transistor NML is turned on, such that the voltage of the match-line ML will drop to low logic state (about 0V). When the resistance state of the first variable resistive element R is MRS, the storage node NX voltage will be lower than the match threshold $V_{TH\text{-}NML}$. Thus, the charge control transistor NML is turned off, such that the voltage of the match-line ML will maintain at high logic state.

Figure 2A:
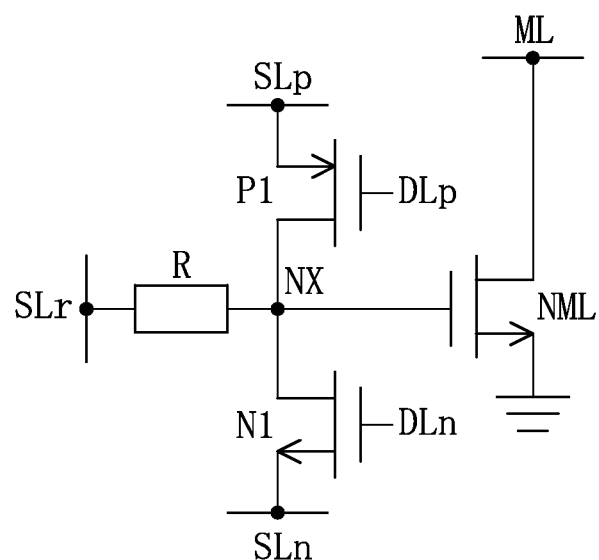
FIG. 2A shows a circuit diagram of a 3T1R cell for a non-volatile ternary content-addressable memory according to another embodiment of the instant disclosure.

Furthermore, please refer to FIG. 2A showing a circuit diagram of a 3T1R cell for a non-volatile ternary content-addressable memory according to another embodiment of the instant disclosure. Based on the 2T1R cell shown in FIG. 1A, a second transistor P1 is added. The second transistor is controlled by a second control signal DLp, wherein a drain electrode of the second transistor P1 is electrically coupled to the storage node NX, and a source electrode of the second transistor P1 is electrically coupled to a high-side search-line SLp. In FIG. 2A, the first transistor N1 and the second transistor P1 can be respectively a NMOS transistor and a PMOS transistor, but this instant disclosure is not so restricted.

Figure 2B:
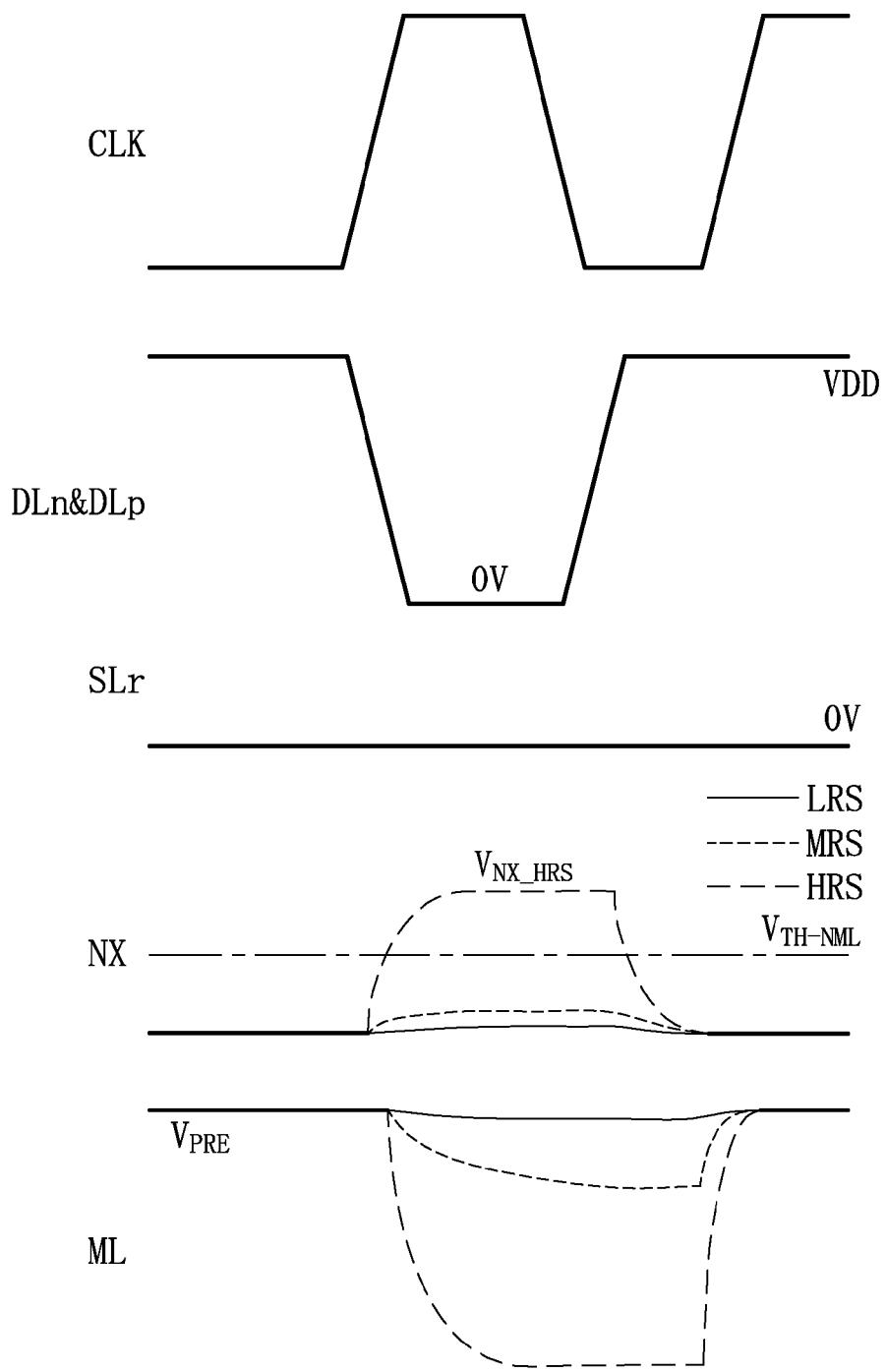
FIG. 2B shows a timing diagram of the 3T1R cell shown in FIG. 2A operating in an operation of searching "1"

Referring to FIG. 2B, in the operation of searching "1", the first transistor N1 is turned off by the first control signal DLn (0V), the second transistor P1 is turned on by the second control signal DLp (0V), the first search-line SLr and the low-side search-line SLn are at a low logic state (0V), and the high-side search-line SLp is applied with a positive bias voltage (Vp). The voltage of the high logic state (VDD) can be higher than the positive bias voltage (Vp), but this instant disclosure is not so restricted. A current flow begins from the high-side search-line SLp, through the second transistor P1 and the first variable resistive element R, to the first search-line SLr. The second transistor P1 and the first variable resistive element R constitute a voltage divider. Accordingly, the voltage of the storage node NX will be determined due to the resistance state (HRS, LRS, or MRS) of the first variable resistive element R. When the resistance state of the first variable resistive element R is LRS, the storage node NX voltage will be lower than the match threshold $V_{TH\text{-}NML}$. Thus, the charge control transistor NML is turned off, such that the voltage of the match-line ML will maintain at high logic state (pre-charge voltage $V_{PRE}$).

When the resistance state of the first variable resistive element R is HRS, the storage node NX voltage will be higher than the match threshold $V_{TH\text{-}NML}$. Thus, the charge control transistor NML is turned on, such that the voltage of the match-line ML will drop to low logic state (about 0V). When the resistance state of the first variable resistive element R is MRS, the storage node NX voltage will be lower than the match threshold $V_{TH\text{-}NML}$. Thus, the charge control transistor NML is turned off, such that the voltage of the match-line ML will maintain at high logic state.

Figure 2C:
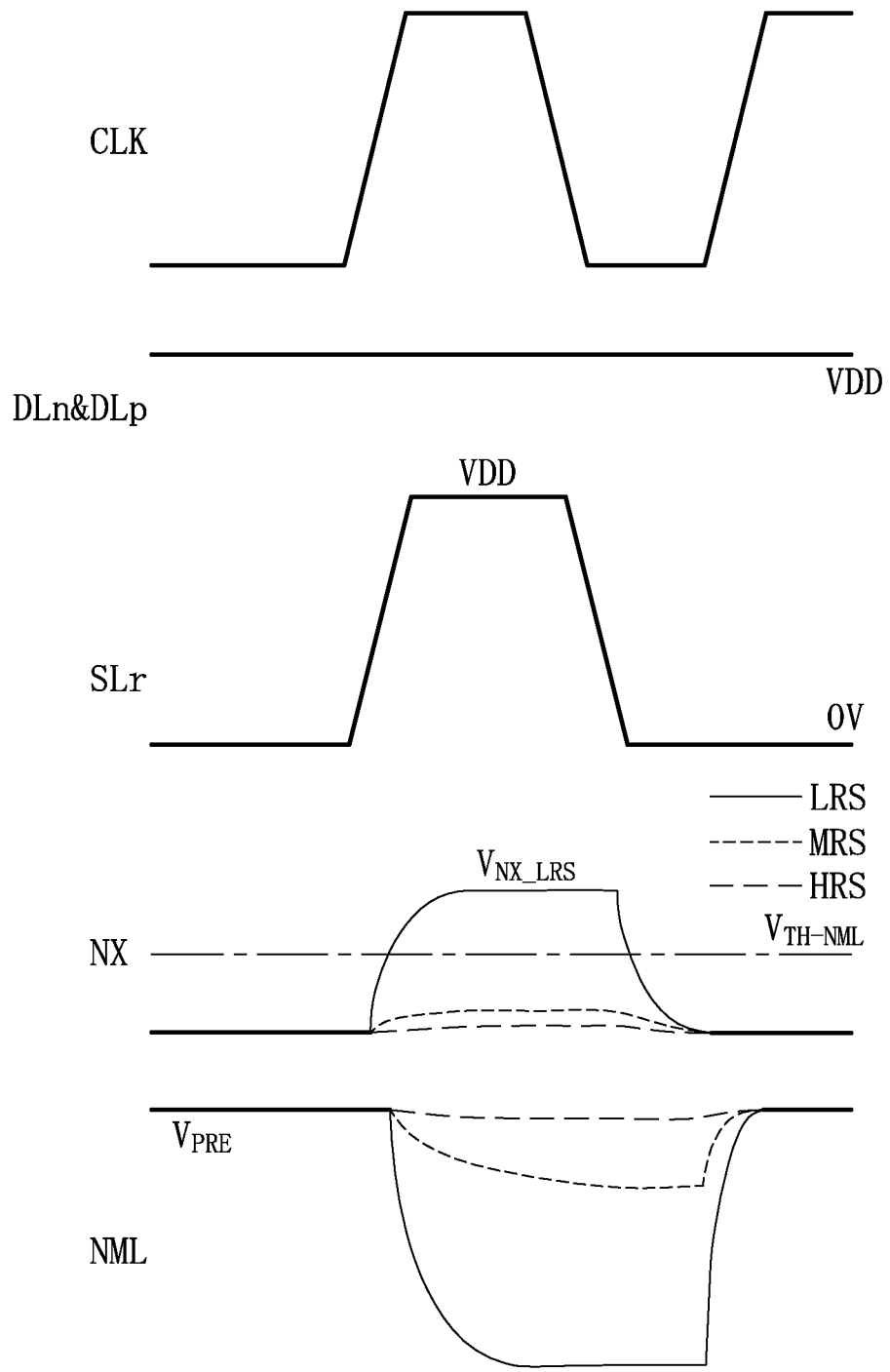
FIG. 2C shows a timing diagram of the 3T1R cell shown in FIG. 2A operating in an operation of searching "0"

Referring to FIG. 2C, in the operation of searching "0", the first transistor N1 is turned on by the first control signal DLn (VDD), the second transistor P1 is turned off by the second control signal DLp (VDD), the first search-line SLr is at a high logic state (VDD), the low-side search-line SLn is at the low logic state (0V), and the high-side search-line SLp is applied by the positive bias voltage (Vp). A current flow begins from the first search-line SLr, through the first variable resistive element R and the first transistor N1, to the low-side search-line SLn. The voltage of the storage node NX will be determined due to the resistance state (HRS, LRS, or MRS). When the resistance state of the first variable resistive element R is LRS, the storage node NX voltage will be higher than the match threshold $V_{TH\text{-}NML}$. Thus, the charge control transistor NML is turned on, such that the voltage of the match-line ML will drop to low logic state (about 0V). When the resistance state of the first variable resistive element R is HRS, the storage node NX voltage will be lower than the match threshold $V_{TH\text{-}NML}$. Thus, the charge control transistor NML is turned off, such that the voltage of the match-line ML will maintain at high logic state. When the resistance state of the first variable resistive element R is MRS, the storage node NX voltage will be lower than the match threshold $V_{TH\text{-}NML}$. Thus, the charge control transistor NML is turned off, such that the voltage of the match-line ML will maintain at high logic state.

Figure 3A:
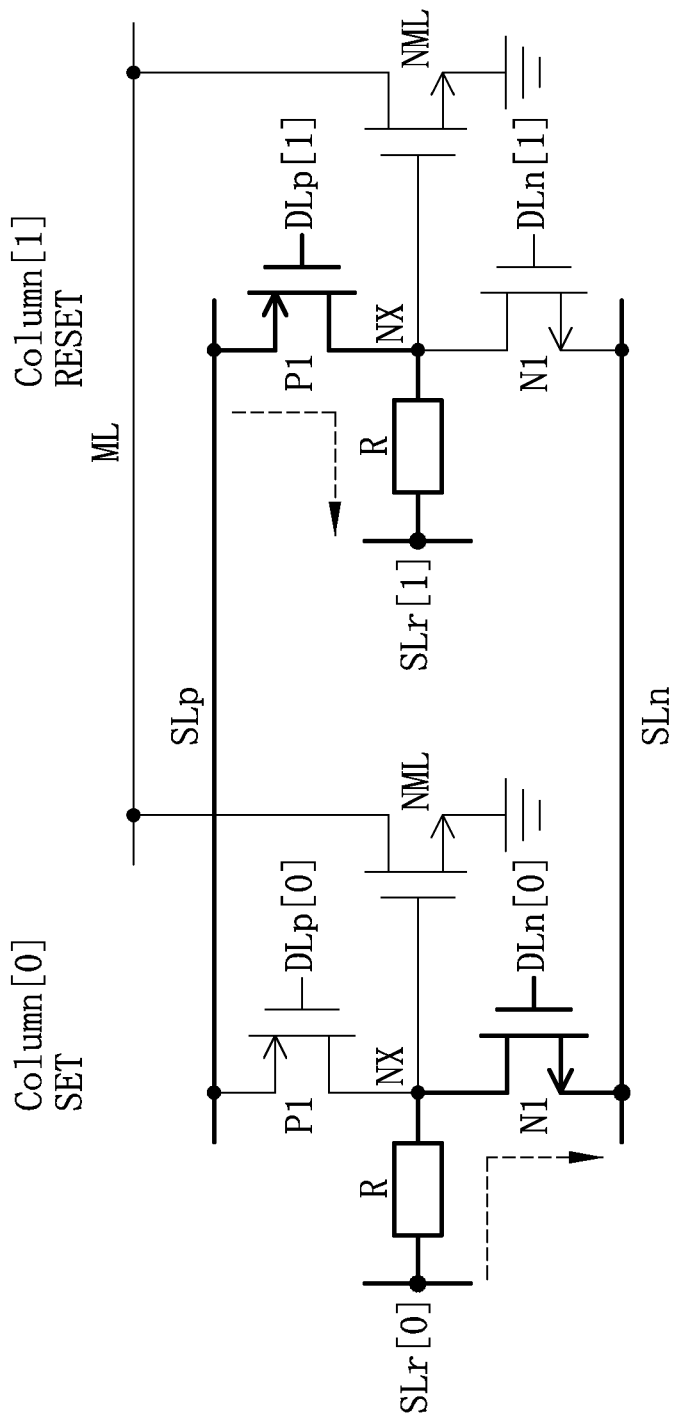
FIG. 3A shows a schematic diagram of two 3T1R cells respectively writing "1" and "0" according to an embodiment of the instant disclosure.

The write operation of the 3T1R cell is described as follows. Please refer to FIG. 3A showing a schematic diagram of two 3T1R cells respectively writing "1" and "0" according to an embodiment of the instant disclosure. Data writing "1" operation is illustrated by a cell in column [0] of a memory array of FIG. 3A (the left cell in FIG. 3A). Data writing "0" operation is illustrated by a cell in column [1] of a memory array of FIG. 3A (the right cell in FIG. 3A). Write phase comprises a "SET" operation and a "RESET" operation. The SET operation sets the first variable resistive element R to be in the low resistance state (LRS). Thus, the cell stores a logic "1" value when the first variable resistive element R is at the low resistance state (LRS). The RESET operation sets the variable resistive element R to be in the high resistance state (HRS). Thus, the cell stores a logic "0" value when the first variable resistive element R is at the high resistance state (HRS). Furthermore, the cell in column [0] and the cell in column [1] share the high-side search-lines SLp, the low-side search-line SLn, and the match-line ML.

Figure 3C:
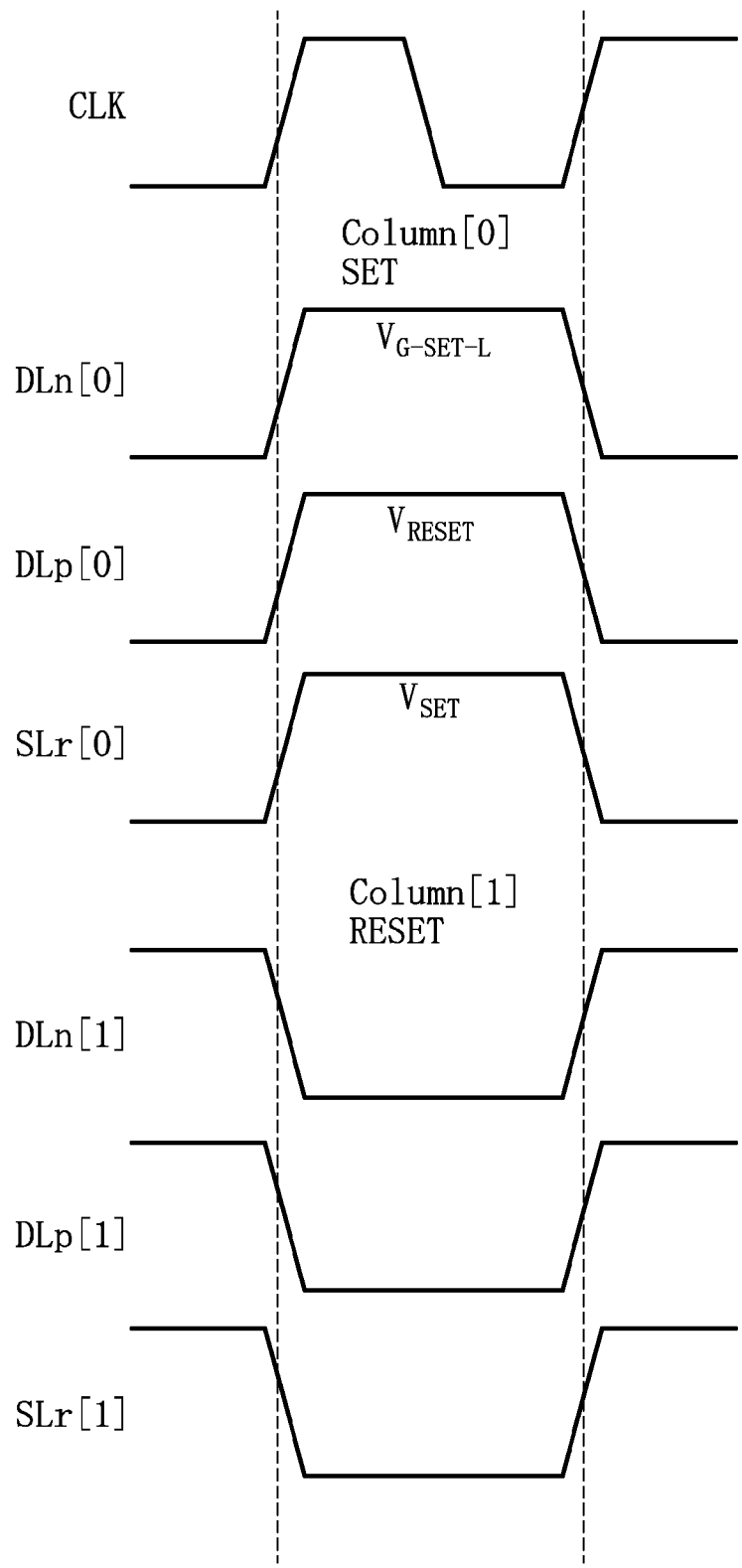
FIG. 3C shows a timing diagram of two 3T1R cells of FIG. 3A respectively writing "1" and "0"

Please refer to FIG. 3B and FIG. 3C. FIG. 3B illustrating a table showing the program states of the 3T1R cells of FIG. 3A respectively writing "1" and "0". FIG. 3C shows a timing diagram of two 3T1R cells of FIG. 3A respectively writing "1" and "0". Considering the cell in column [0] in the SET operation, the first transistor N1 is turned on by a first control signal DLn[0] ($V_{G\text{-}SET\text{-}L}$), and the second transistor P1 is tuned off by a second control signal DLp[0] ($V_{RESET}$). The first search-line SLr[0] is applied with a set voltage ($V_{SET}$), the low-side search-line SLn is at the low logic state (0V). The high-side search-line SLp is applied with a reset voltage ($V_{RESET}$). Accordingly, a current flows from the first search-line SLr[0], through the first variable resistive element R and the first transistor N1, to the low-side search-line SLn, in order to set the variable resistive element R to be at the low resistance state (LRS).

Considering the cell in column [1] in the RESET operation the first transistor N1 is turned off by the first control signal DLn[0] (0V) and the second transistor P1 is turned on by the second control signal DLp[1] (0V). The first search-line SLr and the low-side search-line SLn are at the low logic state (0V). The high-side search-line SLp is applied with a reset voltage ($V_{RESET}$). Accordingly, a current flows from the high-side search-line SLp, through the second transistor P1 and the first variable resistive element R, to the first search-line SLr[1], in order to set the variable resistive element R to be at the high resistance state (HRS).

It can be seen that the logic state of the low-side search-line SLn in the SET operation is the same as the logic state of the low-side search-line SLn in the RESET operation. Also, the logic state of the high-side search-line SLp in the SET operation is the same as the logic state of the low-side search-line SLn in the RESET operation. Therefore, the operation of writing "1" for the cell in the column [0] and the operation of writing "0" for the cell in the column [1] can be done in the same cycle.

Figure 4A:
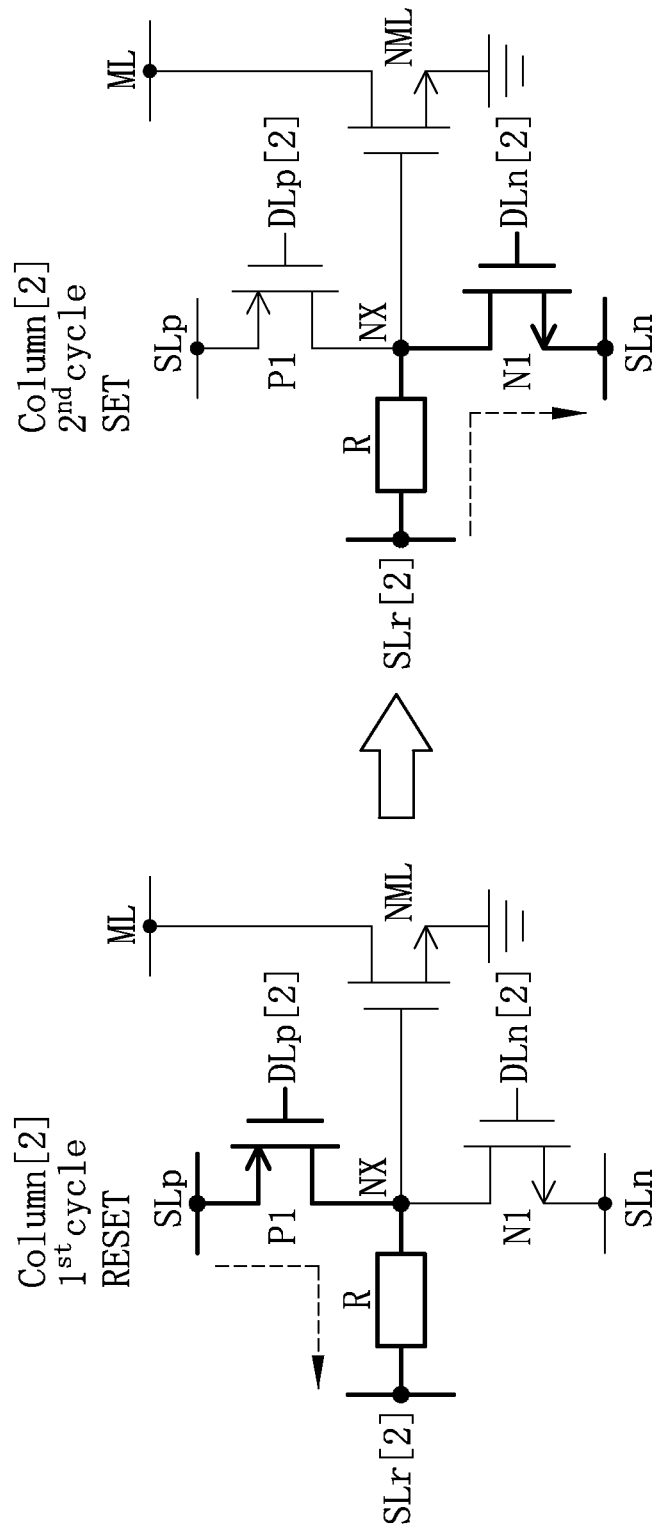
FIG. 4A shows a schematic diagram of a 3T1R cell writing "X" in two cycles according to an embodiment of the instant disclosure.
Figure 4C:
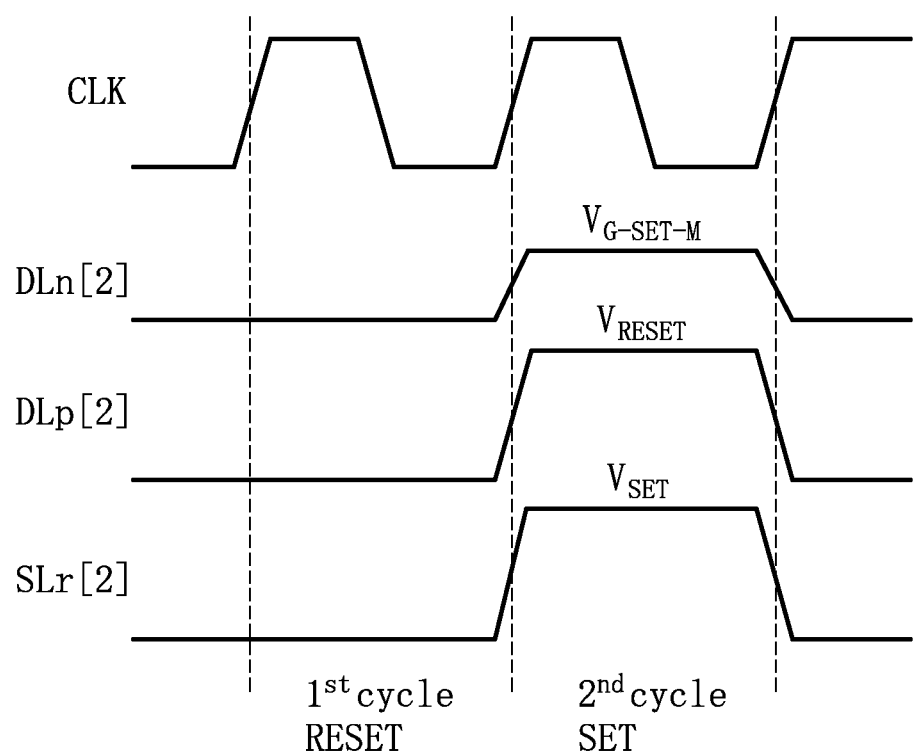
FIG. 4C shows a timing diagram of the 3T1R cells of FIG. 4A writing "X" in two cycles.

However, the operation of writing "X" requires two cycles. Please refer to FIG. 4A showing a schematic diagram of a 3T1R cell writing "X" in two cycles. The cell stores a "don't care" value ("X") by conducting the RESET operation followed by the SET operation in order to set the variable resistive element to be in a medium resistance state (MRS). A cell in column [2] of a memory array performs the RESET operation to set the variable resistive element R be at the high resistance state (HRS), then performs the SET operation to set the variable resistive element R be at the medium resistance state (MRS). The program states and related signal waveforms of the cell can be referred to in FIG. 4B and FIG. 4C.

Figure 5:
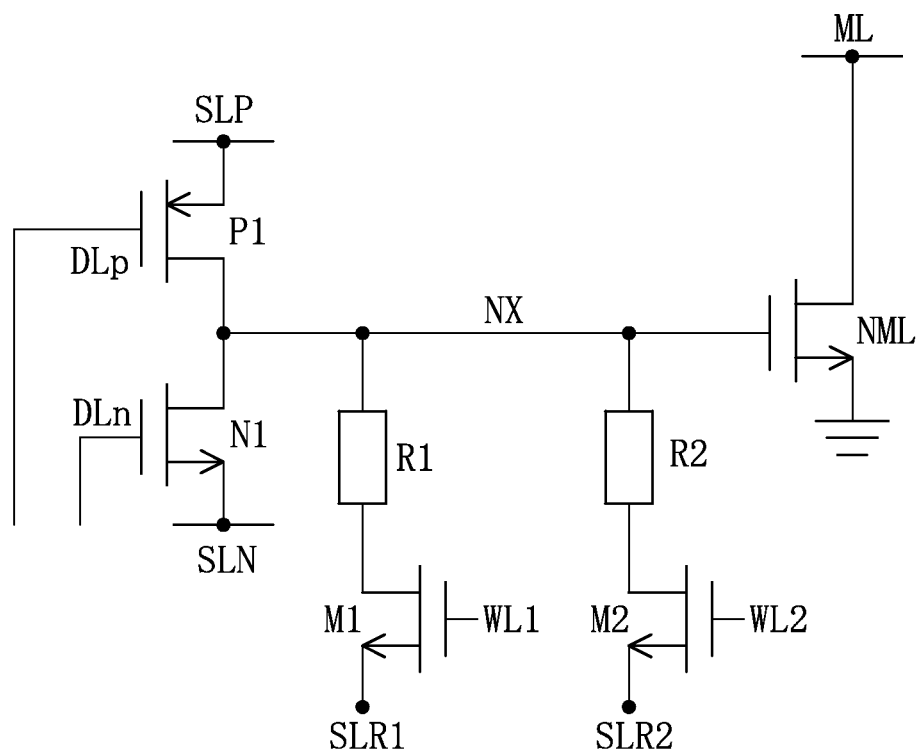
FIG. 5 shows a circuit diagram of a 2.5T1R cell according to another embodiment of the instant disclosure.

Please refer to FIG. 5 showing a circuit diagram of a 2.5T1R cell according to another embodiment of the instant disclosure. The 3T1R cell illustrated in FIG. 2A can be modified to the 2.5T1R cell shown in FIG. 5 by adding a first word-line transistor M1 electrically coupled to a first variable resistive element R1 in series, and adding a second variable resistive element R2 electrically coupled with a second word-line transistor M2 in series. Specifically, the first variable resistive element R in the 3T1R cell of FIG. 2A is renamed to R1. The first search-line SLr in the 2T1R cell is renamed to SLR1. The first terminal of the first variable resistive element R1 is electrically coupled to the first search-line SRL1 through the first word-line transistor M1 if the first word-line transistor M1 is turned on. In the same way, a first terminal of the second variable resistive element R2 is electrically coupled to a second search-line SRL2 through the second word-line transistor M2 if the second word-line transistor M2 is turned on. A second terminal of the second variable resistive element R2 is electrically coupled to the storage node NX. The first word-line transistor M1 and the second word-line transistor M2 respectively controlled by a word-line WL1 and a word-line WL2 are for passing signals. Two bits data is stored in the 2.5T1R cell, wherein a first bit value is stored in the first variable resistive element R1 and a second bit value is stored in the second variable resistive element R2. For the search phase of the cell, the search phase comprises a first phase and a second phase. The first phase comprises an operation of searching "1" and an operation of searching "0" for the first variable resistive element R1.

Figure 6A:
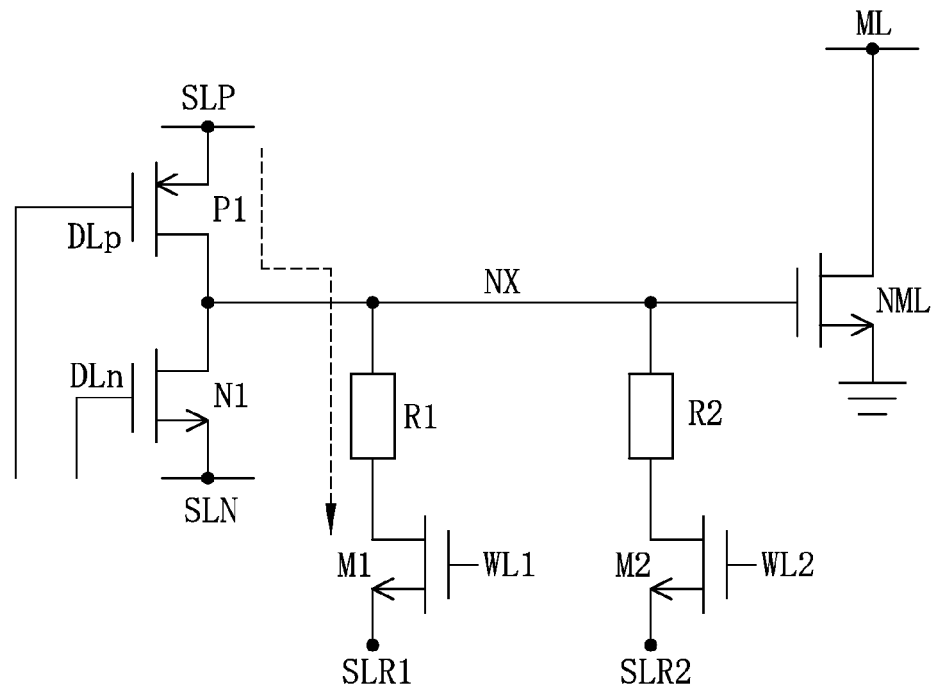
FIG. 6A shows a current flow of the 2.5T1R cell of FIG. 5A performing an operation of searching "1" in the first search phase.

During the operation of searching "1", the first transistor N1 is turned off by the first control signal DLn, and the second transistor P1 is turned on by the second control signal DLp. The first search-line SLR1 and the low-side search-line SLN are at a low logic state (0V), and the high-side search-line SLP is applied with the positive bias voltage (Vp). Thus, a current flows from the high-side search-line SLP, through the second transistor P1 and the first variable resistive element R1, to the first search-line SLR1, referred to in FIG. 6A.

Figure 6B:
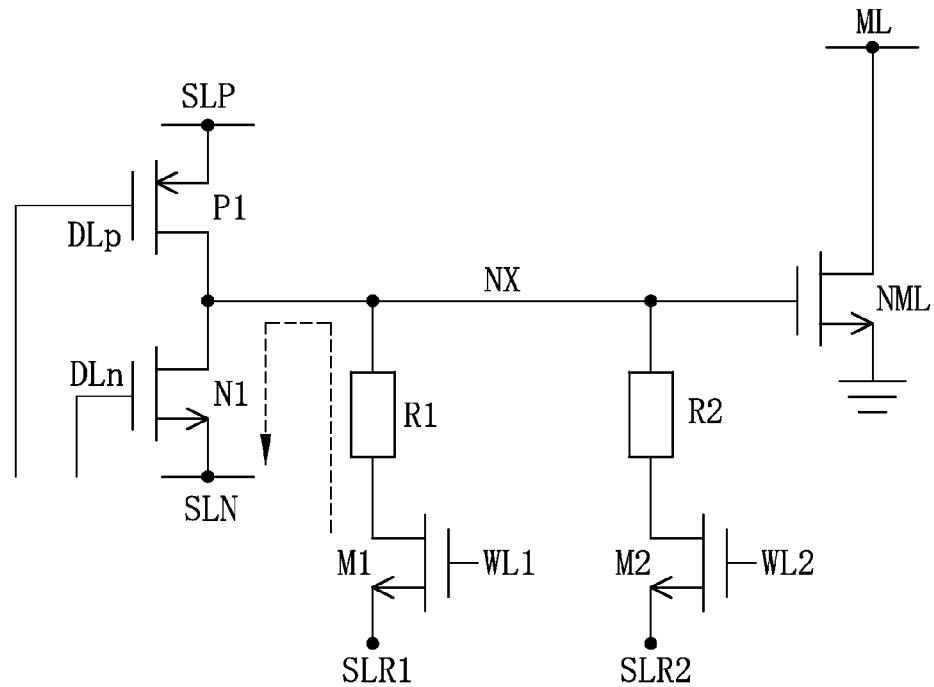
FIG. 6B shows a current flow of the 2.5T1R cell of FIG. 5A performing an operation of searching "0" in the first search phase.

During the operation of searching "0", the first transistor N1 is turned on by the first control signal DLn, and the second transistor P1 is turned off by the second control signal DLp. The first search-line SLR1 is at a high logic state (VDD), the low-side search-line SLN is at a low logic state (0V), and the high-side search-line SLP is applied by a positive bias voltage (Vp). Thus, a current flows from the first search-line SLR1, through the first variable resistive element R1 and the first transistor N1, to the low-side search-line SLN, referred to in FIG. 6B.

Figure 6C:
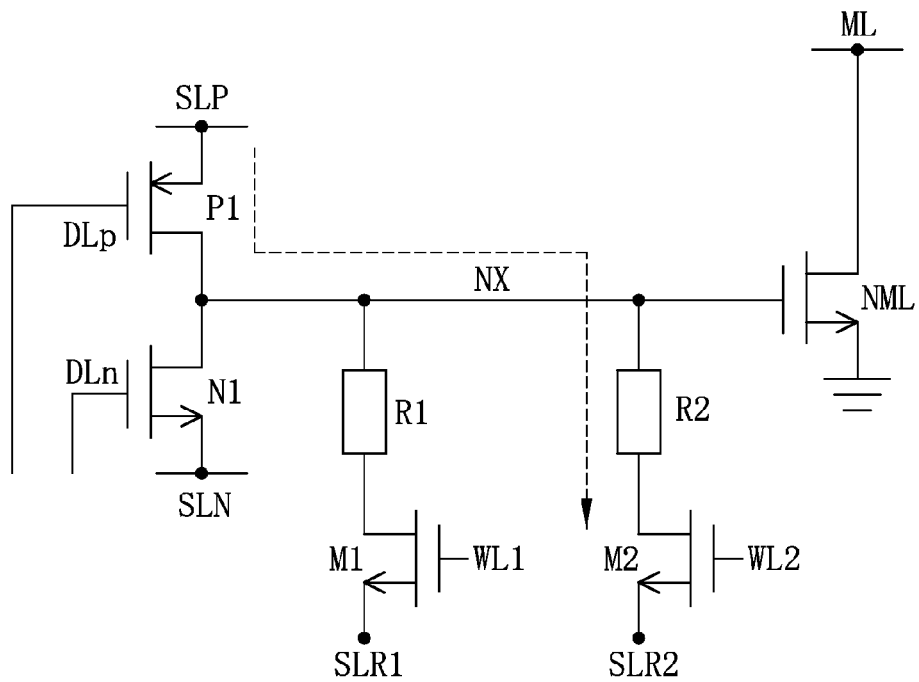
FIG. 6C shows a current flow of the 2.5T1R cell of FIG. 5A performing an operation of searching "1" in the second search phase.

The second phase also comprises an operation of searching "1" and an operation of searching "0" for the second variable resistive element R2. During the operation of searching "1", the first transistor N1 is turned off by the first control signal DLn, and the second transistor P1 is turned on by the second control signal DLp. The second search-line SLR2 and the low-side search-line SLN are at the low logic state (0V), and the high-side search-line SLP is applied with the positive bias voltage (Vp). Thus, a current flows from the high-side search-line SLP, through the second transistor P1 and the second variable resistive element R2, to the second search-line SLR2, referred to in FIG. 6C.

Figure 6D:
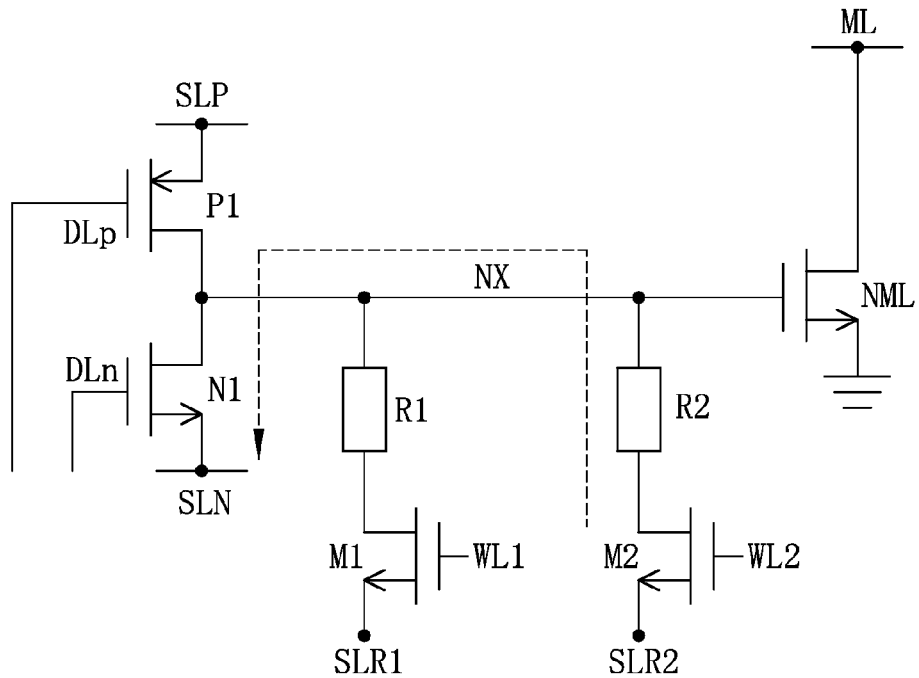
FIG. 6D shows a current flow of the 2.5T1R cell of FIG. 5A performing an operation of searching "0" in the second search phase.

During the operation of searching "0", the first transistor N1 is turned on by the first control signal DLn, and the second transistor P1 is turned off by the second control signal DLp. The second search-line SLR2 is at the high logic state (VDD), the low-side search-line SLN is at the low logic state (0V), and the high-side search-line SLP is applied by the positive bias voltage (Vp). Thus, a current flows from the second search-line SLR2, through the second variable resistive element R1 and the first transistor N1, to the low-side search-line SLN, referred to in FIG. 6D. When all of the two phases are completed, the voltage of the storage node NX will be determined.

Figure 7:
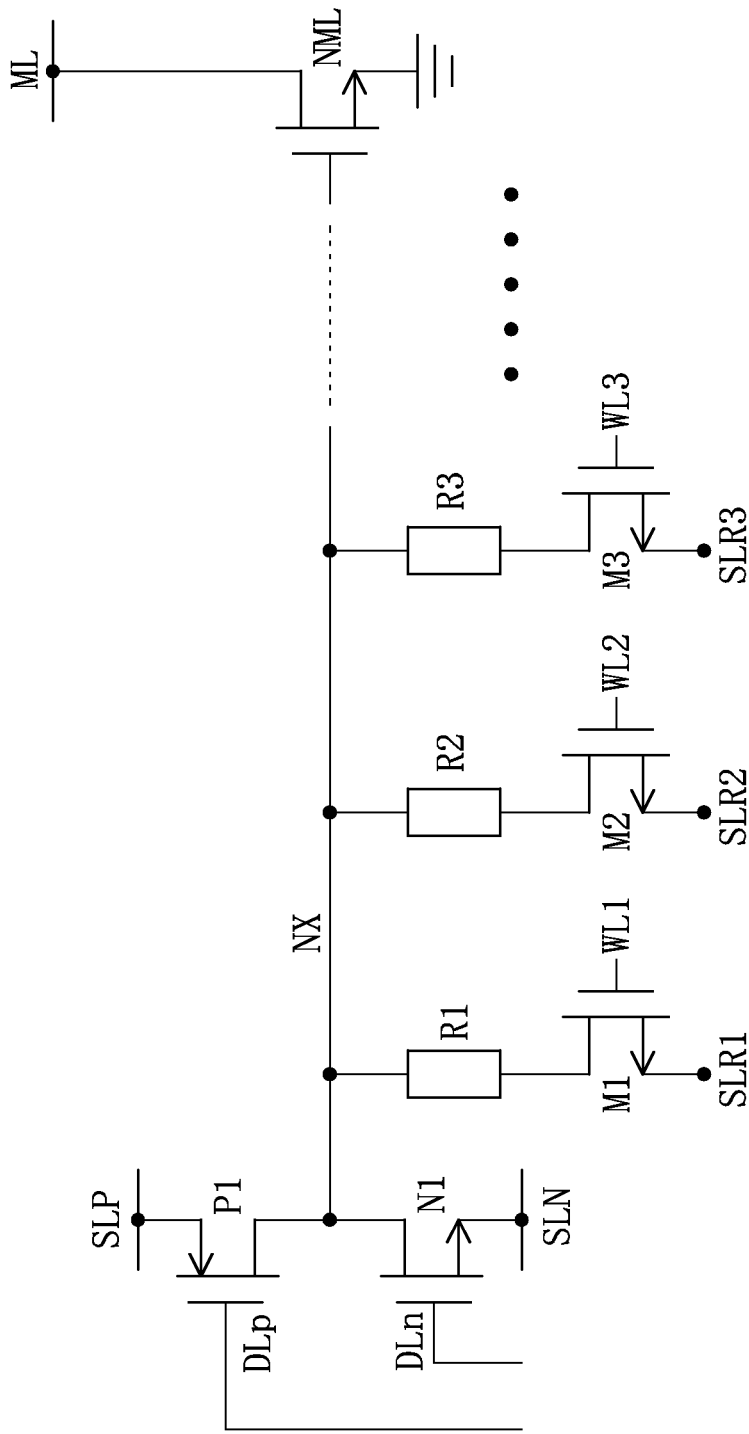
FIG. 7 shows a circuit diagram of a NT1R cell according to another embodiment of the instant disclosure.

FIG. 7 shows a circuit diagram of a NT1R cell according to another embodiment of the instant disclosure. Analogous to the 2.5T1R cell, more variable resistive elements are added to the 3T1R cell. Variable resistive elements R1, R2, R3 . . . are for storing N bits data, wherein N is an integer. As shown in FIG. 7, three variable resistive elements R1, R2, R3 are illustrated for example. Considering the first variable resistive element R1 as an example, the first terminal of the first variable resistive element R1 is electrically coupled to the first search-line SRL through the first word-line transistor M1, and the second terminal of the first variable resistive element R1 is connected to drain electrodes of the first transistor N1 and the second transistor P1, for being the storage node NX. In general, the first terminal of an N-th variable resistive element (RN) is electrically coupled to an N-th search-line (SLRN) through an N-th word-line transistor. And, the second terminals of these N variable resistive elements (R1, R2, R3 . . . ) are connected together for being the storage node NX.

When the NT1R cell operates in a search phase, the first transistor N1 (for search "0") or the second transistor P1 (for search "1") is turned on, and a pulse voltage is sequentially applied across the N-th search-line (SLR1, SLR2, SLR3, . . . SLRN) and one of the low-side search-line SLN and the high-side search-line SLP for determining whether the voltage of the storage node NX is larger than a match threshold during the period of the pulse. The search operation can be referred to in descriptions about the aforementioned 3T1R cell and the 2.5T1R cell. In detail, a search phase of the NT1R cell comprises N phases, an N-th phase comprises an operation of searching "1" and an operation of searching "0". During the operation of searching "1", the first transistor N1 is turned off by the first control signal DLn and the second transistor P1 is turned on by the second control signal DLp, the N-th search-line (SLRN) and the low-side search-line SLN are at a low logic state (0V), the high-side search-line SLP is applied with the positive bias voltage (Vp) described in the aforementioned embodiments. During the operation of searching "0", the first transistor N1 is turned on by the first control signal DLn and the second transistor P1 is turned off by the second control signal DLp, the N-th search-line (SLRN) is at a high logic state (VDD), the low-side search-line SLN is at a low logic state (0V), the high-side search-line SLP is applied by the positive bias voltage (Vp). When all of the N search phases are completed, the voltage of the storage node NX will be determined.

According to above descriptions, the provided 3T1R cell, 2.5T1R cell and NT cell are developed from the architecture of the provided 2T1R cell. The provided 2T1R cell, 3T1R cell, 2.5T1R cell and NT1R cell have smaller cell area, fast search speed, low search energy compared to the conventional non-volatile ternary content-addressable memory cell. Also, the provided 2T1R cell, 3T1R cell, 2.5T1R cell and NT1R cell have free standby cell leakage, and can wake up fast.

The descriptions illustrated supra set forth simply the preferred embodiments of the instant disclosure; however, the characteristics of the instant disclosure are by no means restricted thereto. All changes, alterations, or modifications conveniently considered by those skilled in the art are deemed to be encompassed within the scope of the instant disclosure delineated by the following claims.

What is claimed is:

1. A cell for a non-volatile ternary content-addressable memory, the cell comprising:
    a first variable resistive element, a first terminal of the first variable resistive element electrically coupled to a first search-line, a second terminal of the first variable resistive element being a storage node;
    a first transistor, controlled by a first control signal, wherein a drain electrode of the first transistor is electrically coupled to the storage node, a source electrode of the first transistor is electrically coupled to a low-side search-line; and
    a charge control transistor, electrically coupled to a match-line for controlling the voltage level of the match-line, a gate electrode of the charge control transistor electrically coupled to the storage node;
    wherein when the cell operates in a search phase and the first transistor is turned on by the first control signal, a pulse voltage is applied across the first search-line and the low-side search-line for determining whether the voltage of the storage node is larger than a match threshold during the period of the pulse.

2. The cell for a non-volatile ternary content-addressable memory according to claim 1, wherein the search phase comprises an operation of searching "1" and an operation of searching "0", the low-side search-line is at a high logic state and the first search-line is at a low logic state in the operation of searching "1", the first search-line is at the high logic state and the low-side search-line is at the low logic state in the operation of searching "0".

3. The cell for a non-volatile ternary content-addressable memory according to claim 1, wherein the cell stores a logic "1" value when the first variable resistive element is at a low resistance state (LRS), the cell stores a logic "0" value when the first variable resistive element is at a high resistance state (HRS), the cell stores a logic "X" (don't care) value when the first variable resistive element is at a medium resistance state (MRS).

4. The cell for a non-volatile ternary content-addressable memory according to claim 1, further comprising:
a second transistor, controlled by a second control signal, wherein a drain electrode of the second transistor is electrically coupled to the storage node, a source electrode of the second transistor is electrically coupled to a high-side search-line.

5. The cell for a non-volatile ternary content-addressable memory according to claim 4, wherein the search phase comprises an operation of searching "1" and an operation of searching "0";
wherein during the operation of searching "1", the first transistor is turned off by the first control signal, the second transistor is turned on by the second control signal, the first search-line and the low-side search-line are at a low logic state, and the high-side search-line is applied with a positive bias voltage;
wherein during the operation of searching "0", the first transistor is turned on by the first control signal, the second transistor is turned off by the second control signal, the first search-line is at a high logic state, the low-side search-line is at the low logic state, and the high-side search-line is applied by the positive bias voltage.

6. The cell for a non-volatile ternary content-addressable memory according to claim 5, wherein when the cell operates in a write phase, the write phase comprises a SET operation and a RESET operation; wherein the SET operation sets the first variable resistive element to be in a low resistance state (LRS), the RESET operation sets the first variable resistive element to be in a high resistance state (HRS).

7. The cell for a non-volatile ternary content-addressable memory according to claim 6, wherein the cell stores a logic "1" value when the first variable resistive element is at the low resistance state, the cell stores a logic "0" value when the first variable resistive element is at the high resistance state.

8. The cell for a non-volatile ternary content-addressable memory according to claim 6, wherein in the SET operation the first transistor is turned on and the second transistor is tuned off, the first search-line is applied with a set voltage, the low-side search-line is at the low logic state, the high-side search-line is applied with a reset voltage.

9. The cell for a non-volatile ternary content-addressable memory according to claim 6, in the RESET operation the first transistor is turned off and the second transistor is tuned on, the first search-line and the low-side search-line are at the low logic state, the high-side search-line is applied with a reset voltage.

10. The cell for a non-volatile ternary content-addressable memory according to claim 6, wherein the cell stores a "don't care" value by conducting the RESET operation followed by the SET operation in order to set the variable resistive element to be in a medium resistance state (MRS).

11. The cell for a non-volatile ternary content-addressable memory according to claim 1, wherein the first variable resistive element is utilized as the phase change random-access memory (PCRAM), the resistive random-access memory (RRAM) or the magnetoresistive random-access memory (MRAM).

12. The cell for a non-volatile ternary content-addressable memory according to claim 4, wherein the first transistor is a NMOS transistor, the second transistor is a PMOS transistor.

13. The cell for a non-volatile ternary content-addressable memory according to claim 4, wherein the first terminal of the first variable resistive element is electrically coupled to the first search-line through a first word-line transistor, the cell for the non-volatile ternary content-addressable memory further comprises:
a second variable resistive element, a first terminal of the second variable resistive element electrically coupled to a second search-line through a second word-line transistor, a second terminal of the second variable resistive element electrically coupled to the storage node.

14. The cell for a non-volatile ternary content-addressable memory according to claim 13, wherein a search phase of the cell comprises a first phase and a second phase.

15. The cell for a non-volatile ternary content-addressable memory according to claim 14, wherein the first phase comprises an operation of searching "1" and an operation of searching "0" for the first variable resistive element;
wherein during the operation of searching "1" the first transistor is turned off by the first control signal and the second transistor is turned on by the second control signal, the first search-line and the low-side search-line are at a low logic state, and the high-side search-line is applied with a positive bias voltage;
wherein during the operation of searching "0", the first transistor is turned on by the first control signal and the second transistor is turned off by the second control signal, the first search-line is at a high logic state, the low-side search-line is at a low logic state, and the high-side search-line is applied by a positive bias voltage.

16. The cell for a non-volatile ternary content-addressable memory according to claim 14, wherein the second phase comprises an operation of searching "1" and an operation of searching "0" for the second variable resistive element;
wherein during the operation of searching "1" the first transistor is turned off by the first control signal and the second transistor is turned on by the second control signal, the second search-line and the low-side search-line are at the low logic state, and the high-side search-line is applied with the positive bias voltage;
wherein during the operation of searching "0" the first transistor is turned on by the first control signal and the second transistor is turned off by the second control signal, the second search-line is at the high logic state, the low-side search-line is at the low logic state, and the high-side search-line is applied by the positive bias voltage.

17. A cell for a non-volatile ternary content-addressable memory, the cell comprising:
N word-line transistors, wherein N is an integer;
N variable resistive elements, the variable resistive element having a first terminal and a second terminal, the first terminal of an N-th variable resistive element electrically coupled to a N-th search-line through an N-th word-line transistor, the second terminals of the N variable resistive elements connected together for being a storage node;

a first transistor, controlled by a first control signal, wherein a drain electrode of the first transistor is electrically coupled to the storage node, a source electrode of the first transistor is electrically coupled to a low-side search-line;

a second transistor, controlled by a second control signal, wherein a drain electrode of the second transistor is electrically coupled to the storage node, a source electrode of the second transistor is electrically coupled to a high-side search-line; and a charge control transistor, electrically coupled to a match-line for controlling the voltage level of the match-line, a gate electrode of the charge control transistor electrically coupled to the storage node;

wherein when the cell operates in a search phase, the first transistor or the second transistor is turned on, a pulse voltage is sequentially applied across the N-th search-line and one of the low-side search-line and the high-side search-line for determining whether the voltage of the storage node is larger than a match threshold during the period of the pulse.

18. The cell for a non-volatile ternary content-addressable memory according to claim 17, wherein a search phase of the cell comprises N phases, an N-th phase comprises an operation of searching "1" and an operation of searching "0".

19. The cell for a non-volatile ternary content-addressable memory according to claim 18, wherein during the operation of searching "1" the first transistor is turned off by the first control signal and the second transistor is turned on by the second control signal, the N-th search-line and the low-side search-line are at a low logic state, the high-side search-line is applied with a positive bias voltage.

20. The cell for a non-volatile ternary content-addressable memory according to claim 18, wherein during the operation of searching "0" the first transistor is turned on by the first control signal and the second transistor is turned off by the second control signal, the N-th search-line is at a high logic state, the low-side search-line is at a low logic state, the high-side search-line is applied with a positive bias voltage.

* * * * *